US006170203B1

(12) United States Patent
Schlapfer

(10) Patent No.: US 6,170,203 B1
(45) Date of Patent: Jan. 9, 2001

(54) DOOR CONSTRUCTION FOR A MAGNETICALLY SHIELDED ROOM

(76) Inventor: Urs Schlapfer, Hausmattrain 36, 4600 Olten (CH)

( * ) Notice: Under 35 U.S.C. 154(b), the term of this patent shall be extended for 0 days.

(21) Appl. No.: 09/306,275

(22) Filed: May 6, 1999

Related U.S. Application Data

(60) Provisional application No. 60/085,651, filed on May 15, 1998, and provisional application No. 60/086,060, filed on May 19, 1998.

(51) Int. Cl.[7] ................................................ E04D 13/18

(52) U.S. Cl. ..................... 52/173.1; 52/207; 52/784.1; 174/35 R; 174/35 MS; 49/477

(58) Field of Search ............................... 52/784.1, 173.1, 52/207; 174/35 MS, 35 R

(56) References Cited

U.S. PATENT DOCUMENTS

| 4,370,831 | 2/1983 | Hamilton . |
| 4,561,209 | 12/1985 | Sohlstrom . |
| 4,786,758 | 11/1988 | Zielinski . |
| 4,894,489 | 1/1990 | Takahashi et al. . |
| 4,910,920 | 3/1990 | Nichols . |
| 4,953,324 | 9/1990 | Herrmann . |
| 4,982,053 | 1/1991 | Thornley et al. . |
| 5,013,869 | 5/1991 | Breihaupt . |

(List continued on next page.)

OTHER PUBLICATIONS

Statement of Urs Schlapfer, dated Oct. 18, 1999 (2 pages with Appendices A–D).
Karl–Jurgen Best, Jochen Bork, *Magnetically Shielded Rooms In Diagnostics and Semi–Conductor Technology*, Edition Feb. 1991, (13 pp.).

A. Mager, L. Borek, *Heavily Magnetically Shielded Room For Measurements of Extremely Weak Magnetic Fields* (4 pgs. 501–504).
H. Matsuba, D. Irisawa, A. Yahara, *Superconducting Shield For Biomagnetism Measurement Coupled With Ferro–Magnetic*, (2 pgs.).
Y. Shimbo, K. Nakada, K. Niki, M. Kabasawa, Y. Uchikawa, M. Kotani, *High Tc Superconducting Magnetic Shields for Biomagnetic Applications*, (2 pgs.).
R.J.P. Bain, G.B. Donaldson, C.M. Pegrum, P. Maas A.I. Weir, *A Clinicaly Oriented Shielded Facility For Biomagnetism*, (2 pgs.).
K. Okuda, J. Takeuchi, M. Mukai, S. Kuriki, Y. Uchikawa, M. Kotani, *Designing and Inspecting System of Prefabricated Magnetically Shielded Room For Biomagnetically Shielded Room For Biomagnetism* (2 pgs.).
N. Ishikawa, N. Kasai, H. Kado, *Shielding Factor of the Box–Shaped MSR for SQUID Measurement* (2 pgs.).
Vacuumschmelze, GmbH, *Magnetically Shielded Rooms for Biomagnetic Investigations* (4 pgs).
James P. Antonic, Understanding Shielding, Journal of Interference Technology Engineers' Master (pp. 229, 232, 236).
Vinao O. Kelha, Jussi M. Pukki, Risto S. Peltonen, Auvo J. Penttinen, Risto J. Ilmonimi, and Jarmo J. Heino, Design, Construction, and Performance of a Large–Volume Magnetic Shield, IEEE Transactions on Magnetics, vol. Mag–18, No. 1 Jan. 1982 (11 pgs).
Takenaka Corporation, Perfabricated Magnetically Shielded Room literature (2 pgs.).

Primary Examiner—Richard Chilcot
Assistant Examiner—Patrick J. Chavez
(74) Attorney, Agent, or Firm—Bell, Boyd & Lloyd LLC

(57) ABSTRACT

A door construction for a magnetically shielded room including a door having interior and exterior sections corresponding to the interior and exterior shells of the magnetically shielded room which provides electric and magnetic continuity between the interior and exterior sections of a door and the interior and exterior shells when the door is in the closed position.

26 Claims, 15 Drawing Sheets

U.S. PATENT DOCUMENTS

| | | |
|---|---|---|
| 5,017,736 | 5/1991 | Yarger et al. . |
| 5,045,636 | 9/1991 | Johnasen et al. . |
| 5,120,087 | 6/1992 | Pastva . |
| 5,197,225 | 3/1993 | Yff . |
| 5,223,670 | 6/1993 | Hogan et al. . |
| 5,241,132 | 8/1993 | McCormack . |
| 5,335,464 | 8/1994 | Vanesky et al. . |
| 5,452,550 | 9/1995 | Vanesky et al. . |
| 5,569,878 | 10/1996 | Zielinski . |
| 5,736,671 | 4/1998 | Perala et al. . |
| 5,786,547 | 7/1998 | Zielinski . |

DOOR CONSTRUCTION FOR A MAGNETICALLY SHIELDED ROOM

CROSS-REFERENCE TO RELATED APPLICATION

This application claims the benefit of U.S. Provisional Application No. 60/085,651, filed May 15, 1998 and U.S. Provisional Application No. 60/086,060, filed May 19, 1998.

DESCRIPTION

This invention relates in general to a door construction for a magnetically shielded room, and more particularly to a multiple shell magnetically shielded room which includes a door having multiple sections which maintain consistent pressure around the circumference of the door frame to obtain continuity of electric and magnetic flux in the multiple shells.

BACKGROUND OF THE INVENTION

A magnetically shielded room, commonly referred to as an "MSR," is used to magnetically and electromagnetically isolate sensitive instruments and equipment such as highly sensitive biomagnetic detectors, measuring instruments, and super conductive quantum interference devices, commonly referred to as "SQUIDs." The sensitive instruments are used among other things for biomagnetic research and tests to measure minute magnetic fields. To obtain proper readings and results from the sensitive equipment, the environment for conducting these tests must be extremely magnetically quiet. The MSR provides a magnetically and electromagnetically isolated environment for using this equipment by attenuating stray magnetic fields and other magnetic disturbances created or generated by the earth's magnetic field, power lines, current carrying conductors and moving metal masses such as trains, automobiles, elevators and other large metal objects in the vicinity of the MSR. Except for the power lines which create 50/60 hertz frequencies, the above mentioned influences create low or very low frequencies which often approach DC or zero. The earth's magnetic field is in fact a DC field. Since magnetic and electromagnetic shielding of DC and low frequencies is difficult to obtain, the ideal MSR includes multiple shells which have shielding layers or shields of very high magnetic permeability and highly electrically conductive materials capable of attenuating these various frequencies.

The MSR must also provide a stable and homogeneous environment for the small, if any, remaining residual field in the MSR near the measuring instrument. To achieve this stable and homogeneous environment, the MSR is preferably a six sided cube having a floor, a ceiling, four walls and a door in one of the walls for providing access to the interior chamber of the MSR. In the ideal MSR, the floor, ceiling, walls and door have multiple magnetic and electromagnetic shielding layers or shields to obtain high attenuation characteristics and to produce the desired stable and homogeneous environment in the interior chamber of the MSR. To obtain this stable and homogenous environment, the shielding layers or shields must be continuous or provide substantial continuity of the electric and magnetic flux in the electrically conductive and magnetically permeable shielding layers or shields. It is difficult to achieve this continuity between the door of the MSR and the surrounding walls or door frame due to the physical separation necessary to form the door.

To achieve the continuity between the door and the door frame, all air gaps must be eliminated between the outer peripheral edge of the multiple shielding layers or shields in the door and the inner edge of the door frame. Ideally, a substantial, continuous and even pressure is required between the door and the door frame. Previous MSRs have employed a single door having multiple layers. However, due to manufacturing tolerances and the size of the air gap between the multiple layers or shields, a one piece door will not guarantee the desired uniform electric and magnetic continuity between the door and the door frame or between the doors and the shielding layers or shields adjacent to the door. Moreover, conventional door hinges and conventional locking mechanisms will not provide the desired continuous contact to eliminate the air gaps between the shielding layers or shields in the door and door frame.

SUMMARY OF THE INVENTION

The present invention overcomes the above problems in providing a multiple section door construction for a multiple shell MSR having shielding layers of very high magnetic permeability and highly electrically conductive materials to attenuate magnetic and electromagnetic disturbances in the vicinity of the MSR. The door construction of the present invention includes interior and exterior sections corresponding with the interior and exterior shells of the MSR and provides consistent pressure around the perimeter of the door frame to obtain continuity of the electric and magnetic flux in the interior and exterior shells. The interior and exterior sections of the door are each pivotally attached to the door frame and are connected to each other by a synchronization assembly. The door construction of the present invention further includes a pneumatic locking system having multiple locking mechanisms for securing each section of the door to assure even pressure between each section of the door and the door frame. This eliminates air gaps between each section and the corresponding shell and provides electric and magnetic continuity in the interior and exterior shells of the MSR.

It is therefore an object of the present invention to provide a door construction for an MSR with multiple shells and high attenuation characteristics.

A further object of the present invention is to provide a door construction for an MSR which provides electric and magnetic continuity between the shielding layers or shields in the wall of the MSR which defines a door frame and the shielding layers or shields in the door of the MSR.

A still further object of the present invention is to provide a door construction for a MSR having interior and exterior electrically and magnetically isolating shells and a door having synchronized interior and exterior sections with corresponding isolating layers or shields which provide electric and magnetic continuity between the interior and exterior sections of the door and the interior and exterior shells of the MSR.

Other objects, features and advantages of the present invention will be apparent from the following detailed disclosure, taken in conjunction with the accompanying sheets of drawings, wherein like reference numerals refer to like parts.

DESCRIPTION OF THE INVENTION

Figure 1:
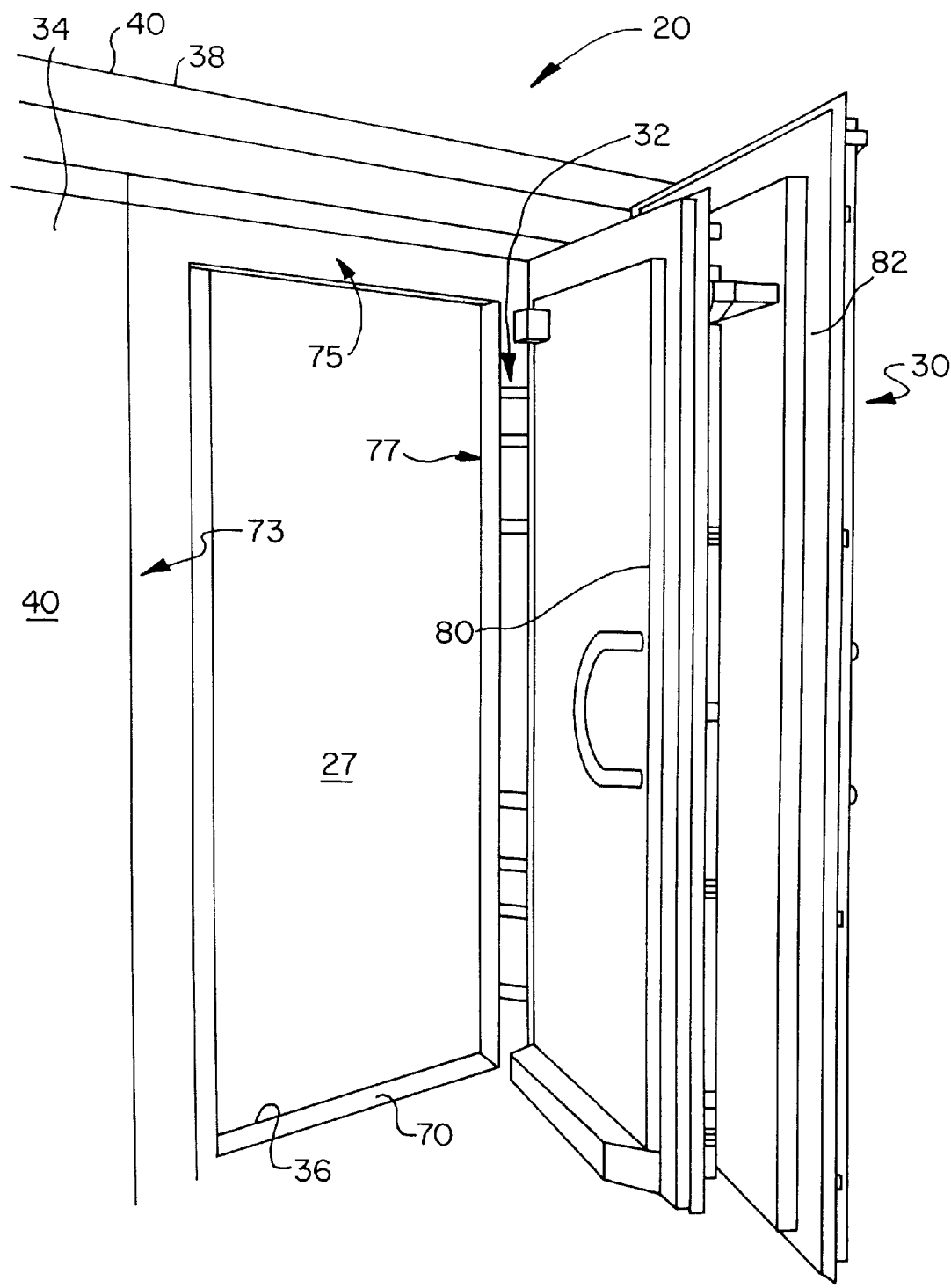
FIG. 1 is a fragmentary perspective view of the wall of the MSR and the door of the present invention in open position.

Referring now to the drawings, and particularly to FIGS. 1 to 5, a magnetically shielded room (MSR) 20 includes a floor 36, a ceiling 38 and two pairs of spaced-apart connected walls 34. The walls 34 are attached to the floor 36 and support the ceiling 38. The floor 36, ceiling 38 and walls 34 define a magnetically quiet interior chamber 27 in the MSR 20 for sensitive equipment. The MSR 20 is preferably situated in a parent building to protect the MSR 20 from the elements as well as to prevent people and objects from accidentally contacting the floor 36, ceiling 38 and walls 34 of the MSR 20. One of the walls 34 of the MSR 20 includes a door, generally indicated by the numeral 30, constructed according to the present invention for providing access to the interior chamber 27 of the MSR 20 while maintaining the high attenuation characteristics of the MSR 20.

The door 30 of the present invention includes an interior section 80 and an exterior section 82 which are both pivotally connected to a door frame 32. The door frame 32 is defined by one of the walls 34 of the MSR 20 and by a threshold 70 which extends through and along the base of such wall 34. The floor 36, ceiling 38 and the walls 34 of the MSR 20 cooperate with each other to define an interior shell 42 (FIG. 4) and an exterior shell 40 which surrounds the interior shell 42. The exterior and interior shells 40 and 42 are evenly spaced-apart throughout the MSR 20 by a plurality of separators (not depicted).

Figure 4:
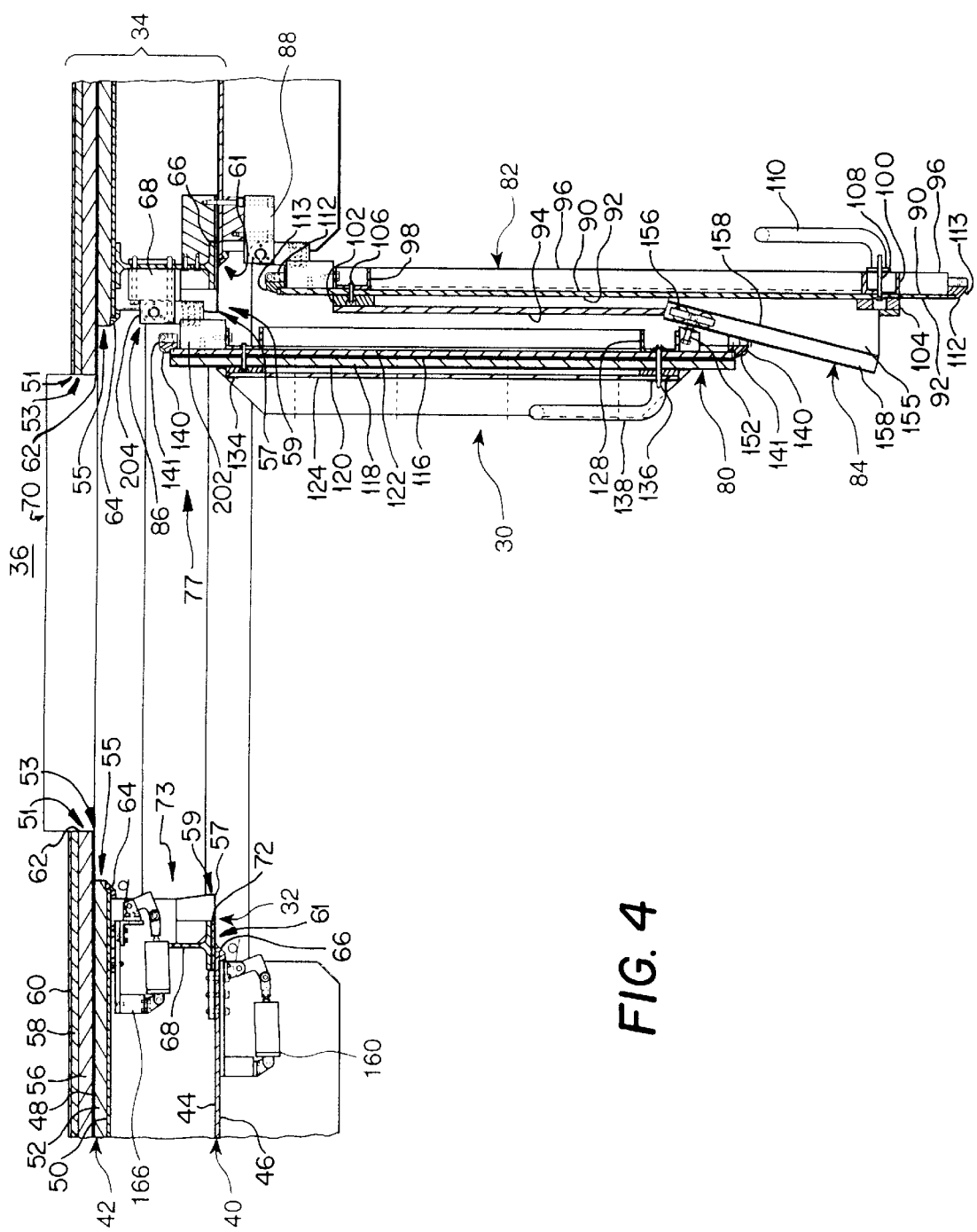
FIG. 4 is a horizontal cross-sectional view of the door construction of the present invention, illustrating the interior and exterior sections of the door pivotally attached to the door frame by inner and outer hinges, the synchronization assembly between the interior and exterior door sections, and further illustrating the inner and outer pneumatic locking mechanisms on the non-hinge side of the door frame.

Referring to FIG. 4, the exterior shell 40 includes inner and outer shielding layers or shields 44 and 46, respectively. The outer shield 46 is preferably formed from a highly electrically conductive material such as aluminum, which may be a single sheet or multiple layers. The inner shield 44 is preferably formed from a highly magnetically permeable material such as a nickel alloy, which may be a single sheet or multiple layers. The preferred nickel alloy is approximately 80% nickel and is commercially available under the trade name MUMETAL.

The interior shell 42 also includes inner and outer shielding layers or shields 48 and 50, respectively. The outer shield 50 is preferably formed from a highly electrically conductive material such as aluminum, which may be a single sheet or multiple layers. The inner shield 48 is preferably formed from a highly magnetically permeable material such as the same nickel alloy as the inner shield 44. The inner and outer shields 44, 46, 48 and 50 of the interior and exterior shells 40 and 42 may be formed from any material having characteristics similar to the ones described above. The inner and outer shields 48 and 50 of the interior shell 42 are magnetically decoupled and dielectrically separated by a non-conductive insulating layer 52 such as wood or other suitable material and insulation members (not depicted). The wall 34 further includes an insulating layer 56 of wooden strips adjacent to the inner shield 48, an intermediate layer 58 of chipboard and a wallpaper or covering 60.

The exterior and interior shells 40 and 42 are magnetically decoupled, and physically and dielectrically separated. The inner shields 44 and 48 of the exterior and interior shells 40 and 42 shield electromagnetic fields of DC to high frequency. The outer shields 46 and 50 of the exterior and interior shells 40 and 42 shield electromagnetic fields of low to high frequency. The exterior and interior shells 40 and 42 thereby co-act to attenuate the stray magnetic fields of various frequencies and the magnetic disturbances created or generated by the earth's magnetic field, power lines, current carrying conductors and moving metal masses near or in the vicinity of the MSR 20 to create an extremely magnetically quiet environment in the interior chamber 27 of the MSR 20.

The door frame 32 defines four openings increasing in size from the interior to the exterior of the MSR 20. The threshold 70 and an innermost edge 51 of the door frame 32, which includes the inner shield 48, the insulating layer 56, the intermediate layer 58 and the covering 60, define a first opening 53 in the interior shell 42. The innermost edge 51 of the door frame 32 is covered by a non-conductive flashing member 62 suitably secured thereto by adhesive. The first opening 53 is preferably rectangular in shape. A conductive inner contact or bearing member 64, preferably made of brass, partially caps the edges of the outer shield 50 and the insulating layer 52. The inner contact 64 is suitably secured thereto by screws. The threshold 70 and the inner edges of the outer shield 50, the insulating layer 52 and the inner contact 64 define a second opening 55. The second opening 55 is preferably a slightly larger rectangular opening in the interior shell 42. Threshold 70 and an inner edge 57 of the inner shield 44 of the exterior shell 40 define a third opening 59. The third opening 59 is preferably a still larger rectangular opening in the exterior shell 40. A conductive outer contact or bearing member 66, preferably made of brass, partially caps the inner edge of the outer shield 46 of the exterior shell 40. The outer contact 66 is suitably secured thereto by screws. The threshold 70 and the inner edges of the outer shield 46 and the outer contact 66 define a fourth opening 61. The fourth opening 61 is preferably a larger rectangular opening in the exterior shell 40.

Figure 5:
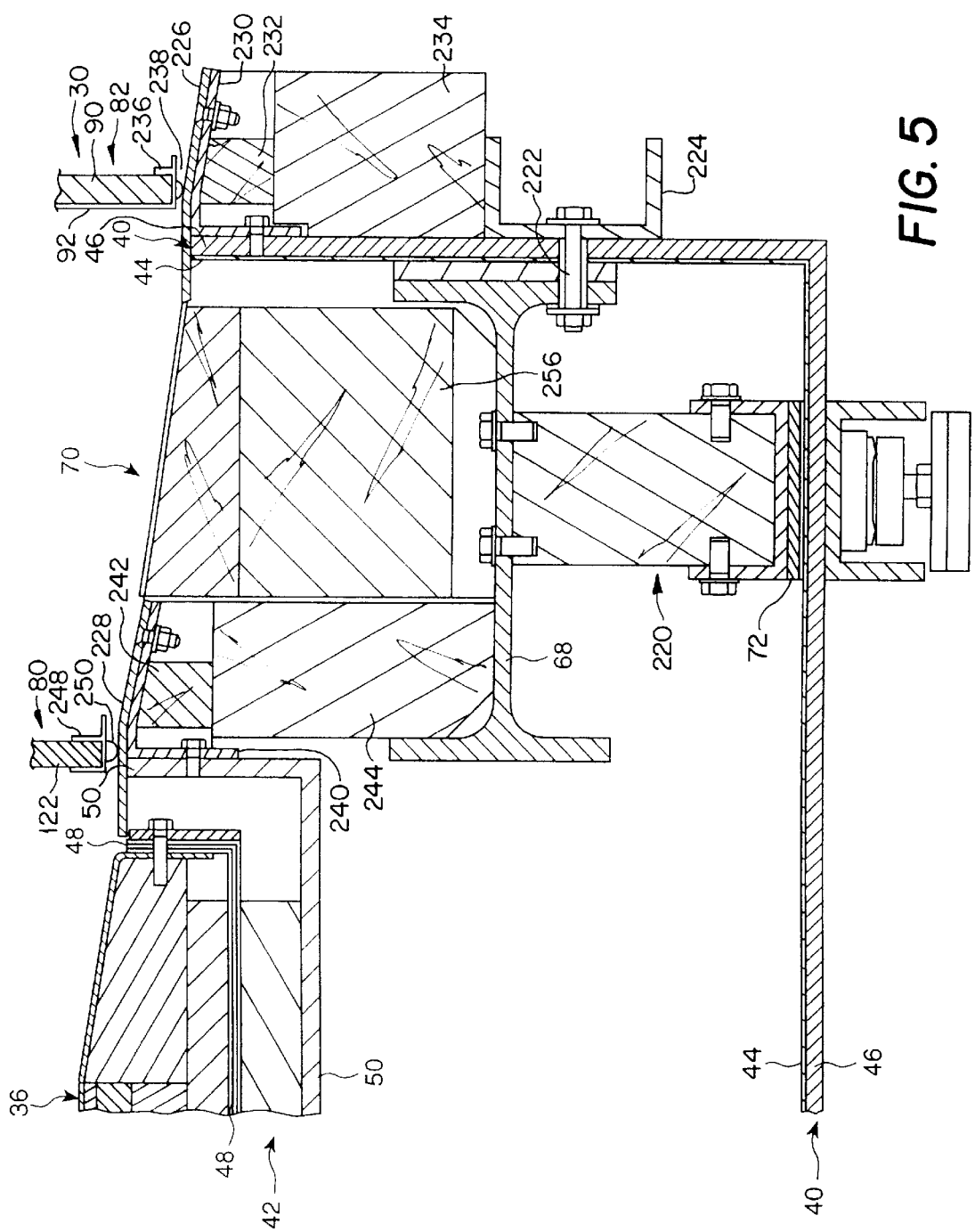
FIG. 5 is a fragmentary vertical cross-sectional view of threshold of the door frame of the present invention.

Referring to FIGS. 4 and 5, the door frame 32 includes an I-beam 68 which extends between the inner shield 44 of the exterior shell 40 and the outer shield 50 of the interior shell 42 and is disposed around the entire door frame 32, including the entire width of the threshold 70 as illustrated in FIG. 5. The I-beam 68 is formed from a non-magnetically permeable material such as aluminum. Referring to FIG. 5, an insulating layer 72 is positioned between the I-beam 68 and the inner shield 44 of the exterior shell 40 to obtain dielectric isolation or separation. The I-beam 68 is maintained or secured between the exterior and interior shells 40 and 42 by various electrically isolated bolts penetrating the exterior shell 40 and the outer shield 50 of the interior shell 42. The threshold 70 of the door construction of the present invention includes the exterior shell 40 and the interior shell 42. The exterior and interior sections 82 and 80 of the door 30 align with the exterior and interior shells 40 and 42 of the threshold 70 when the door 30 is in the closed position to provide substantial electric and magnetic continuity between the bottom of the door 30 and the threshold 70. The I-beam 68 of the threshold 70 is supported by a floor column or separator 220 and is connected to the exterior shell 40 by a plurality of fasteners 222 and a C-shaped bracket or stud 224. The threshold 70 includes an exterior threshold 226 and an interior threshold 228, both preferably made of a conductive material such as brass. It should be appreciated that the exterior and interior thresholds 226 and 228 could be made of other suitable conductive materials.

The exterior threshold 226 is supported by an exterior threshold bracket 230 which is attached to the exterior shell 40. The exterior threshold bracket 230 is further supported by upper and lower supports 232 and 234, preferably made of wood. The upper support 232 rests on the lower support 234 which in turn rests on the bracket 224.

The exterior threshold 226 contacts the inner and outer shields 44 and 46 of the exterior shell 40. The exterior section 82 of the door 30 includes an outer shield 90, an inner shield 92 and an upside down T-shaped conductive bearing member 236 which is attached to the bottom edge of the outer shield 90 and the inner shield 92. The T-shaped bearing member 236 includes a plurality contact fingers 238, preferably made of a beryllium copper, which contact the exterior threshold 226 to create electric and magnetic continuity between the outer and inner shields 90 and 92 of the exterior to section 82 of the door 30 and the outer and inner shields 46 and 44 of the exterior shell 40 when the door is in the closed position.

The interior threshold 228 is supported by an interior threshold bracket 240 which is attached to the interior shell 42. The interior threshold bracket 240 is further supported by upper and lower supports 242 and 244, preferably made of wood. The upper support 242 rests on the lower support 244 which in turn rests on the I-beam 68. The interior threshold 228 contacts the outer shield 50 of the interior shell 42 and is separated from the inner shield 48 of the interior shell 42. The interior section 80 of the door 30 includes an outer shield 122 and an upside down T-shaped conductive bearing member 248 which is attached to the bottom edge of the outer shield 122. The T-shaped bearing member 248 includes a plurality of contact fingers 250, preferably made of a beryllium copper, which contact the interior threshold 228 to create electric and magnetic continuity between the outer shield 122 of the interior door section 80 of the door 30 and the outer shield 50 of the interior shell 42 when the door 30 is in the closed position.

The threshold 70 further includes a non-conductive floor tile 252 which extends between the exterior and interior thresholds 226 and 228. The tile 252 is supported by a pair of upper and lower supports 254 and 256, preferably made of wood. The upper support 254 rests on the lower support 256 which in turn rests on the I-beam 68.

Figure 2:
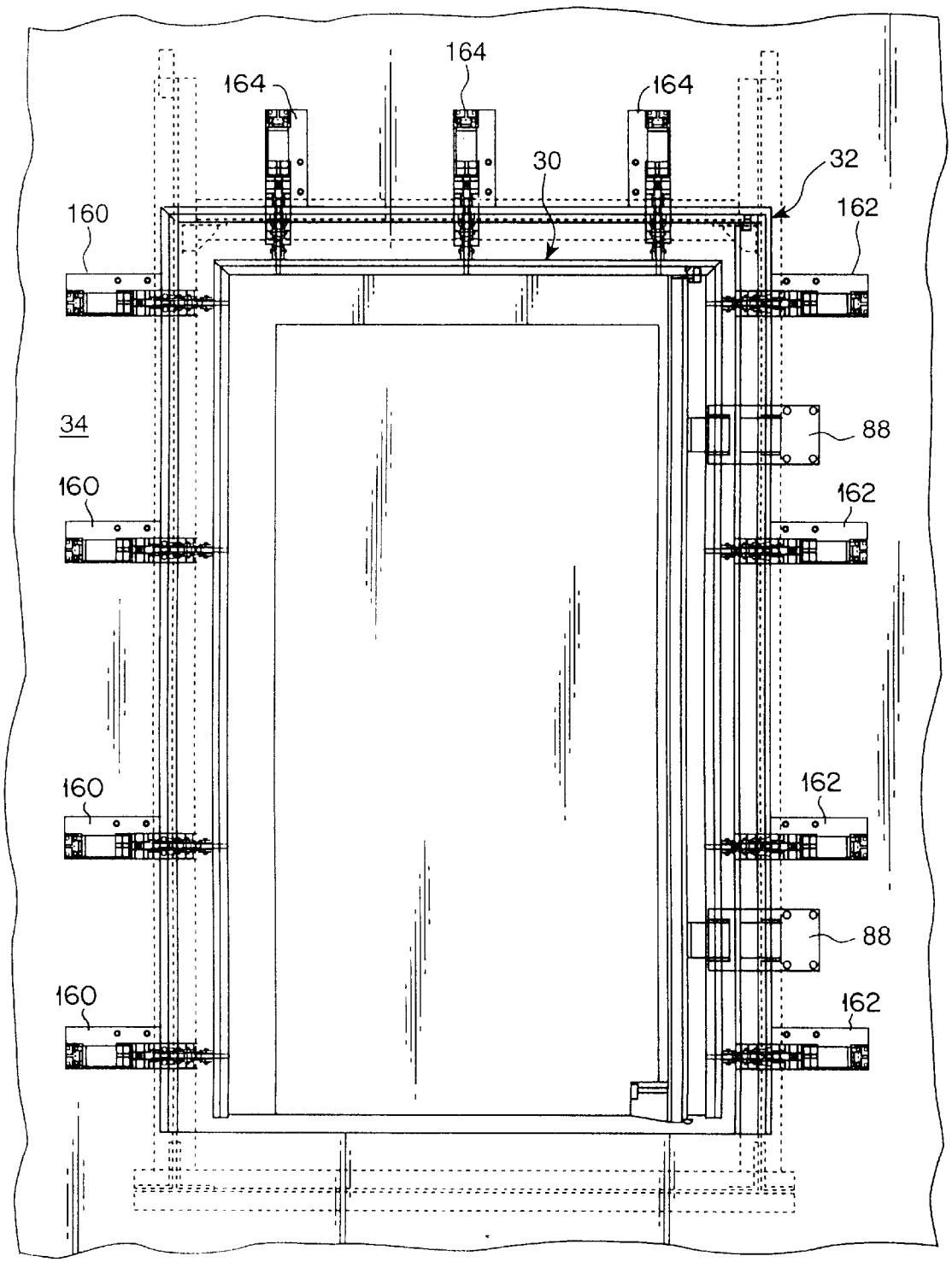
FIG. 2 is a plan view of the exterior section of the door of the present invention illustrating the door in the closed position, the door frame, the outer hinges and the outer pneumatic locking mechanisms.
Figure 3:
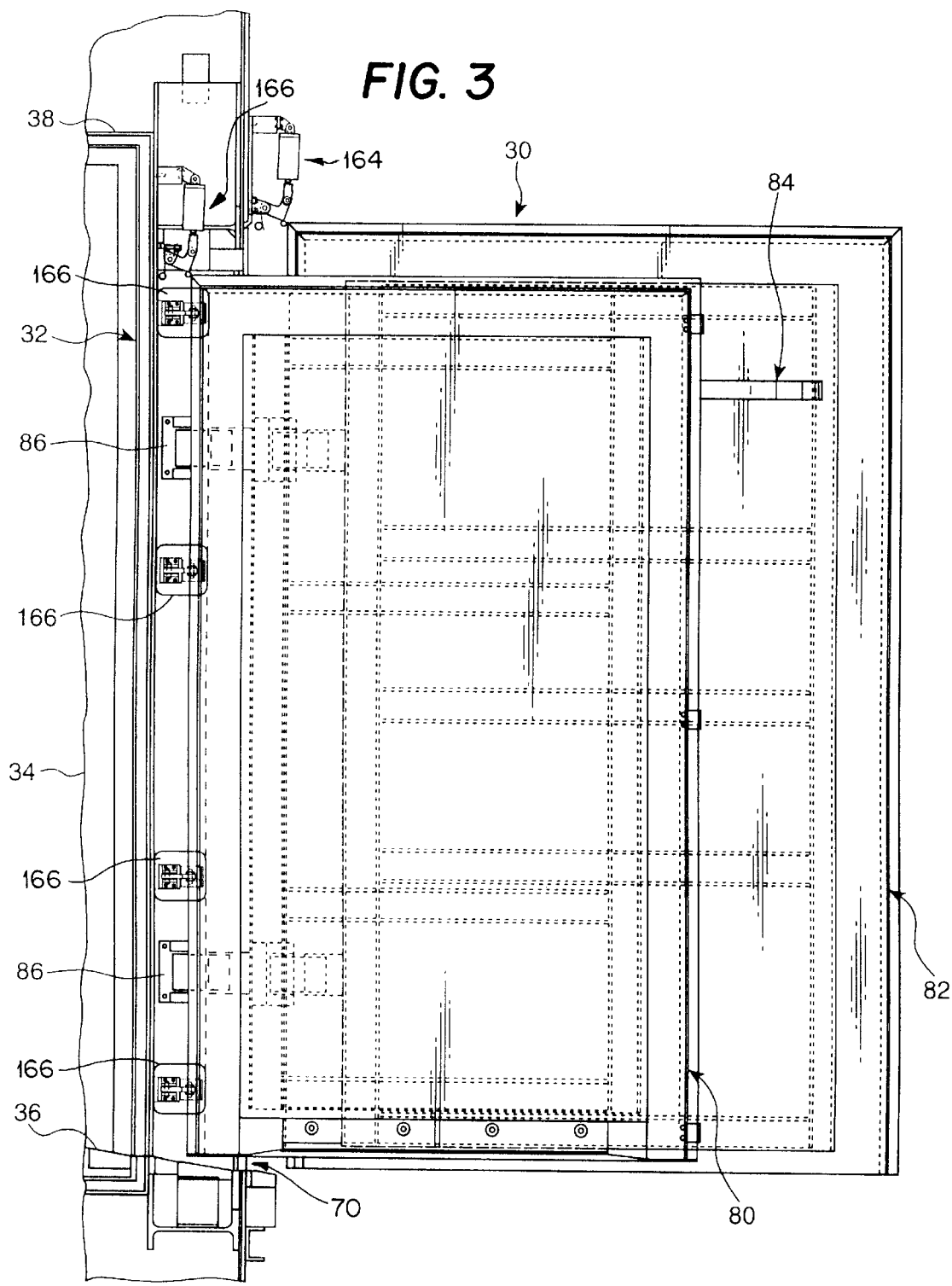
FIG. 3 is a plan view of the door construction of the present invention illustrating the interior and exterior sections of the door in the open position, the hinge side door frame, the inner hinges pivotally connecting the interior section of the door to the door frame, the inner pneumatic locking mechanisms on the hinge side door frame, the inner and outer pneumatic locking mechanisms on the head of the door frame, and the threshold of the door frame.
Figure 6:
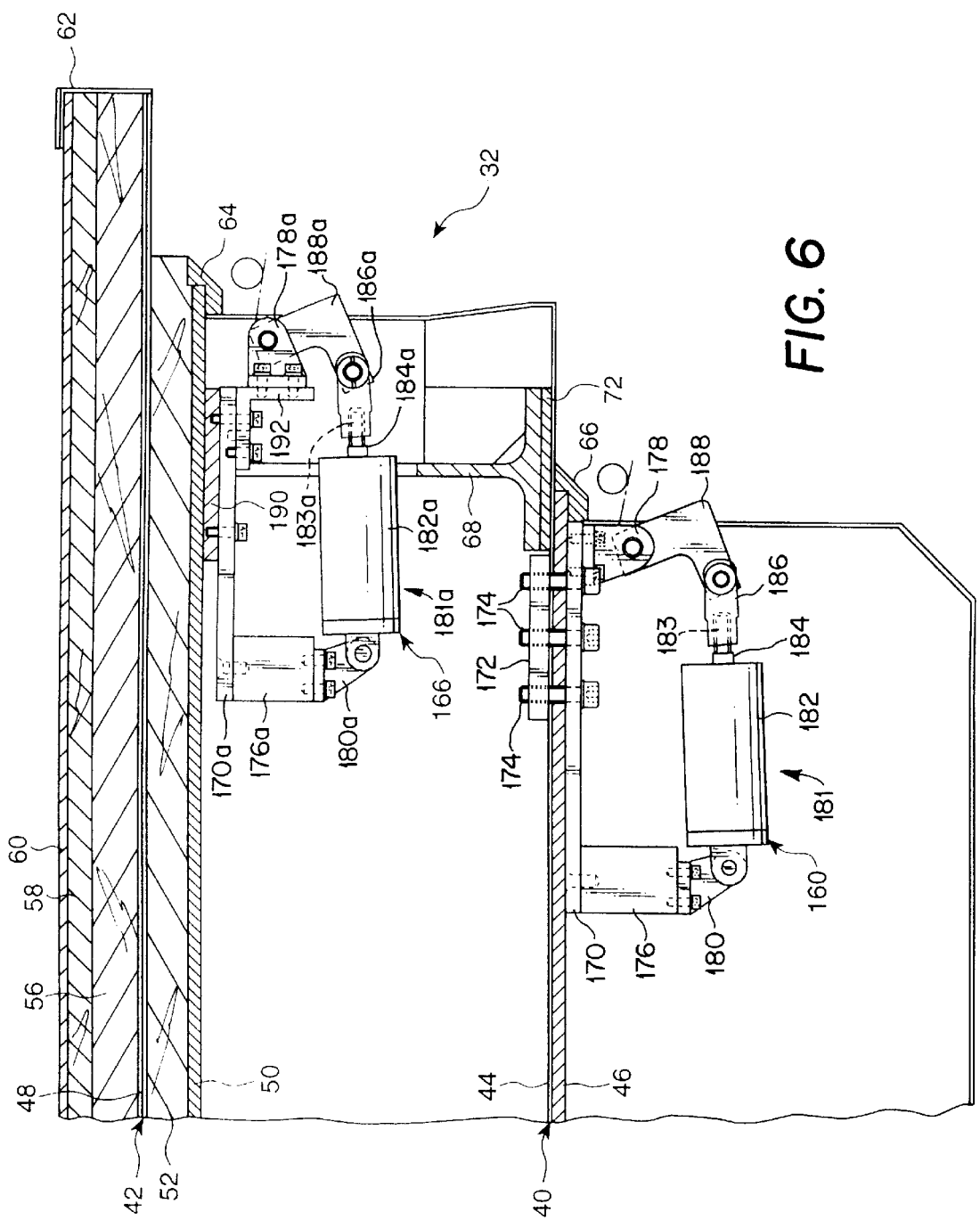
FIG. 6 is an enlarged fragmentary horizontal cross-sectional view of the non-hinge side of the door frame, illustrating the inner and outer pneumatic locking mechanisms.
Figure 7:
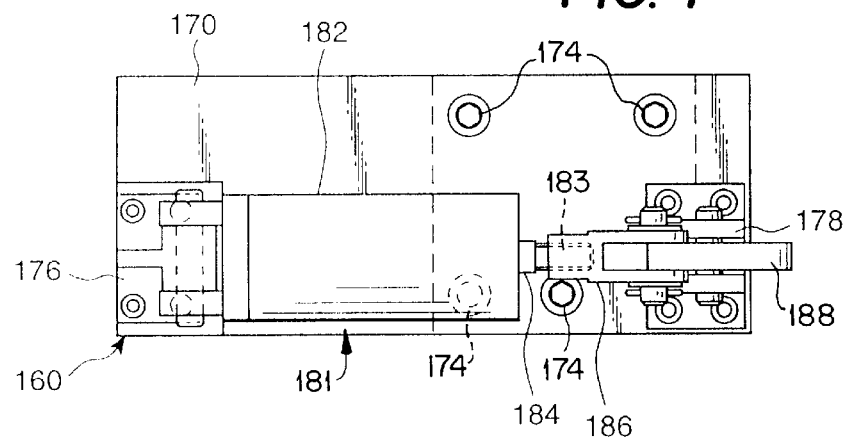
FIG. 7 is a top plan view of the non-hinge side outer pneumatic locking mechanism.
Figure 8:
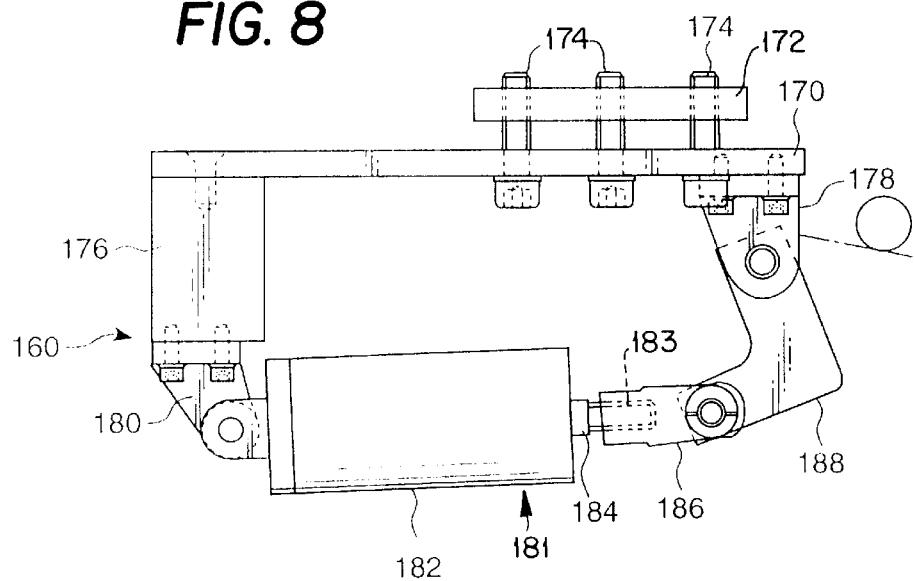
FIG. 8 is a side plan view of the non-hinge side outer pneumatic locking mechanism.
Figure 9:
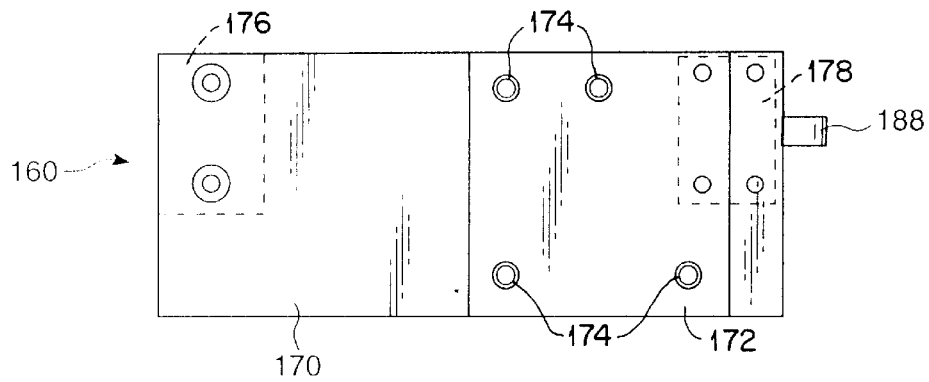
FIG. 9 is a bottom plan view of the non-hinge side outer pneumatic locking mechanism.
Figure 10:
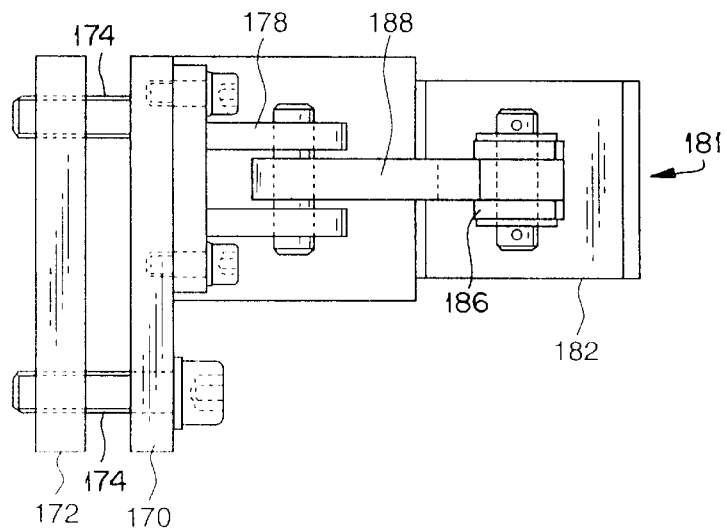
FIG. 10 is an end view of the non-hinge side outer pneumatic locking mechanism.
Figure 24:
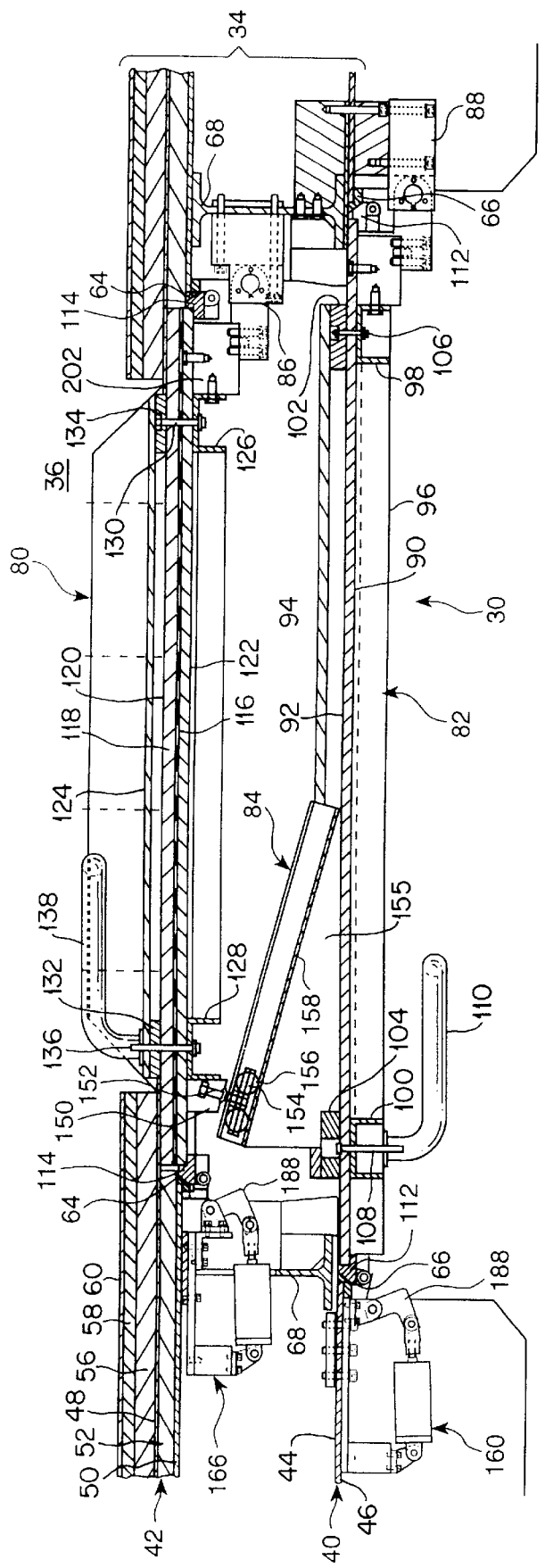
FIG. 24 is a horizontal cross-sectional view of the interior and exterior sections of the door in the closed and unlocked position in the door frame.

Referring again to FIG. 4, the door frame 32 includes a non-hinge side 73, a head 75 (FIG. 1) and a hinge side 77. A plurality of pneumatic locking mechanisms 160, 162, 164 and 166 are disposed around the door frame 32 along the non-hinge side 73, the head 75 and the hinge side 77 and are connected to the exterior and interior shells 40 and 42. The pneumatic locking mechanisms 160, 162, 164 and 166 co-act to lock the door 30 in place when the door 30 is in a closed position. Outer and inner pneumatic locking mechanisms 160 and 166, respectively, are attached to the non-hinge side 73 of the door frame 32, as illustrated in FIGS. 2, 6 and 24. The outer pneumatic locking mechanisms 160 are attached to the exterior shell 40 of the MSR 20, and the inner pneumatic locking mechanisms 166 are attached to the interior shell 42 of the MSR 20. As illustrated in FIGS. 6 to 10, the outer pneumatic locking mechanisms 160 include a rectangular mounting plate 170, a base plate 172 and a plurality of bolts 174 which secure the outer pneumatic locking mechanisms 160 to the exterior shell 40. The base plate 172 is disposed interior to the exterior shell 40, adjacent to the inner shield 44 of the exterior shell 40; the mounting plate 170 is disposed exterior to the exterior shell 40, adjacent to the outer shield 46 of the exterior shell 40, and the bolts 174 extend from the mounting plate 170, through the exterior shell 40 and connect with the base plate 172.

The outer pneumatic locking mechanisms 160 further include a pneumatic operation assembly 181. The pneumatic operation assembly 181 includes a pneumatically operated double action cylinder 182, a piston 184 having a free end 183 extendible from the cylinder 182, a fork 186 secured to the free end 183 of the piston 184 and an L-shaped locking or actuating lever or arm 188 which is pivotally attached at one end to the fork 186. The pneumatic operation assembly is supported by a support block 176 and a bearing support 180 at one end and by a separate bearing support 178 at the other end. The support block 176 and bearing support 180 combination spans between the mounting plate 170 and the pneumatic operation assembly 181. The support block 176 is connected to the mounting plate 170, and the bearing support 180 is pivotally connected to one end of the pneumatic cylinder 182. The other bearing support 178 also spans between the mounting plate 170 and the pneumatic operation assembly 181. The bearing support 178 is connected to the mounting plate 170 at one end and is pivotally attached to the L-shaped locking arm 188 on the other end.

As illustrated in FIGS. 6 and 12 to 15, the inner pneumatic locking mechanisms 166 are substantially similar to the outer pneumatic locking mechanisms 160, except for a few differences. The inner pneumatic locking mechanism 166 is attached to the I-beam 68 instead of being attached directly to the interior shell 42, and the inner pneumatic locking mechanism 166 uses an L-shaped bracket 192 in addition to the support bearing 178a to support the pneumatic operation assembly 181. The mounting plate 170a of the inner pneumatic locking mechanism 166 is attached to a mounting base 190 of the I-beam 68 by various bolts. The mounting base 190 of the I-beam 68, in turn, is attached to the interior shell 42 of the MSR 20. The L-shaped bracket 192 is connected to the mounting plate 170a and to the bearing support 178a to support the locking arm 188a of the inner pneumatic locking mechanism. This alternative construction of the inner pneumatic locking mechanism 166 provides the locking mechanism 166 with the ability to extend the locking arm or lever 188a further outward than the outer pneumatic locking mechanism 160 is able to extend the locking arm 188.

Figure 11:
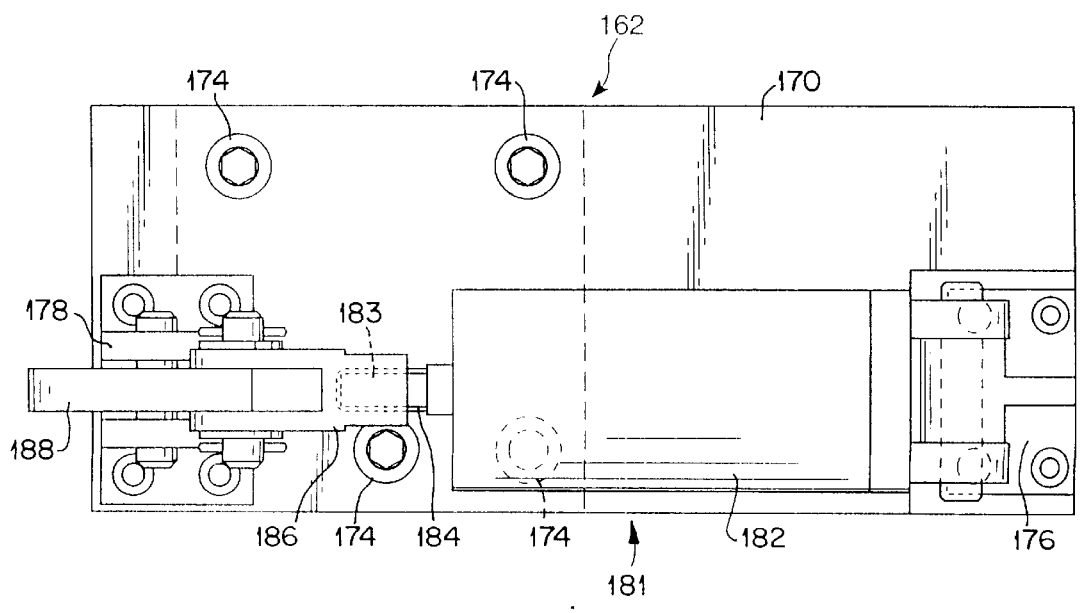
FIG. 11 is a top plan view of the hinge-side outer pneumatic locking mechanism.
Figure 12:
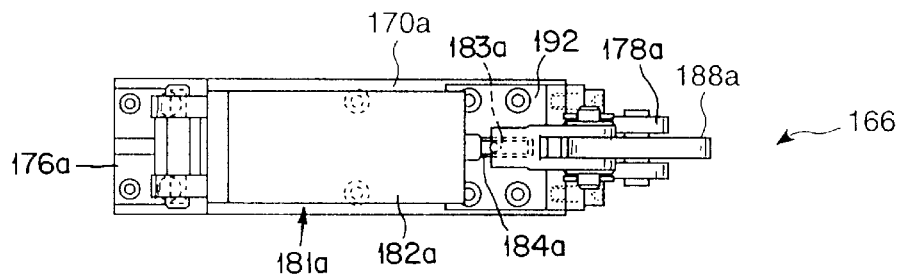
FIG. 12 is a top plan view of the inner pneumatic locking mechanism.
Figure 13:
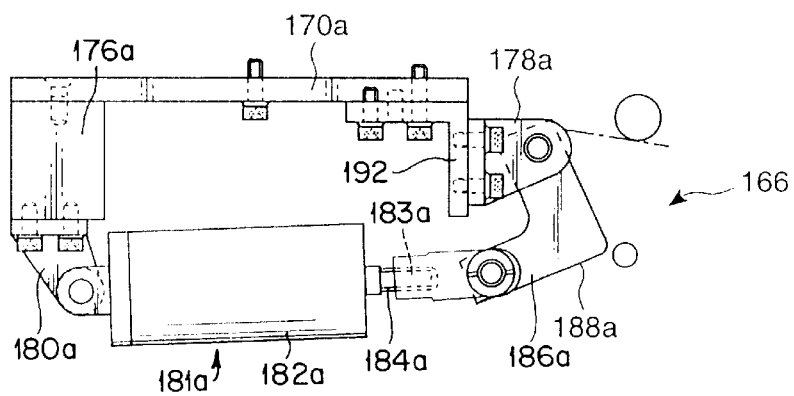
FIG. 13 is a side plan view of the inner pneumatic locking mechanism.
Figure 14:
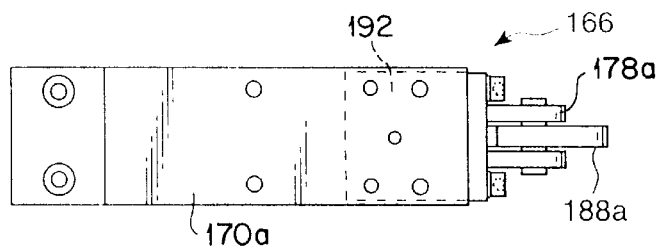
FIG. 14 is a bottom plan view of the inner pneumatic locking mechanism.
Figure 15:
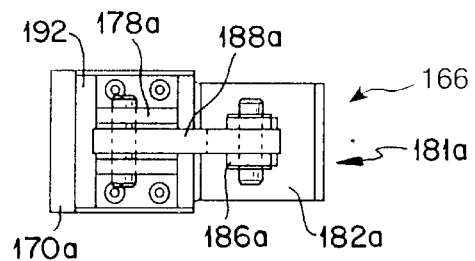
FIG. 15 is an end view of the inner pneumatic locking mechanism.

The outer pneumatic locking mechanisms 162 and 164 of the hinge side 77 and the head 75 of the door frame 32, respectively, are identical to the outer pneumatic locking mechanisms 160 of the non-hinge side 73 of the door frame 32, with the exception that all of the hinge side outer pneumatic locking mechanisms 162 and some of the door frame head outer pneumatic locking mechanisms 164 are the mirror image of the non-hinge side outer pneumatic locking mechanisms 160, as illustrated in FIGS. 2 and 11. Similarly, the inner pneumatic locking mechanisms (not depicted) of the hinge side 77 and the head 75 of the door frame 32 are identical, except for mirror imaging, to the inner pneumatic locking mechanisms 166 of the non-hinge side 73 of the door frame 32. Although not shown, pneumatic lines are attached to each pneumatic locking mechanism 160, 162, 164 and 166 in a conventional manner to activate and deactivate each pneumatic cylinder 182. When the pneumatic cylinder 182 is activated, the piston 184 extends outwardly from the pneumatic cylinder 182 causing the locking arm 188 to rotate toward the mounting plate 170 and the base 172. When the pneumatic cylinder 182 is deactivated, the piston 184 retracts into the pneumatic cylinder 182 causing the locking arm 188 to rotate back toward the cylinder 182.

Figure 16:
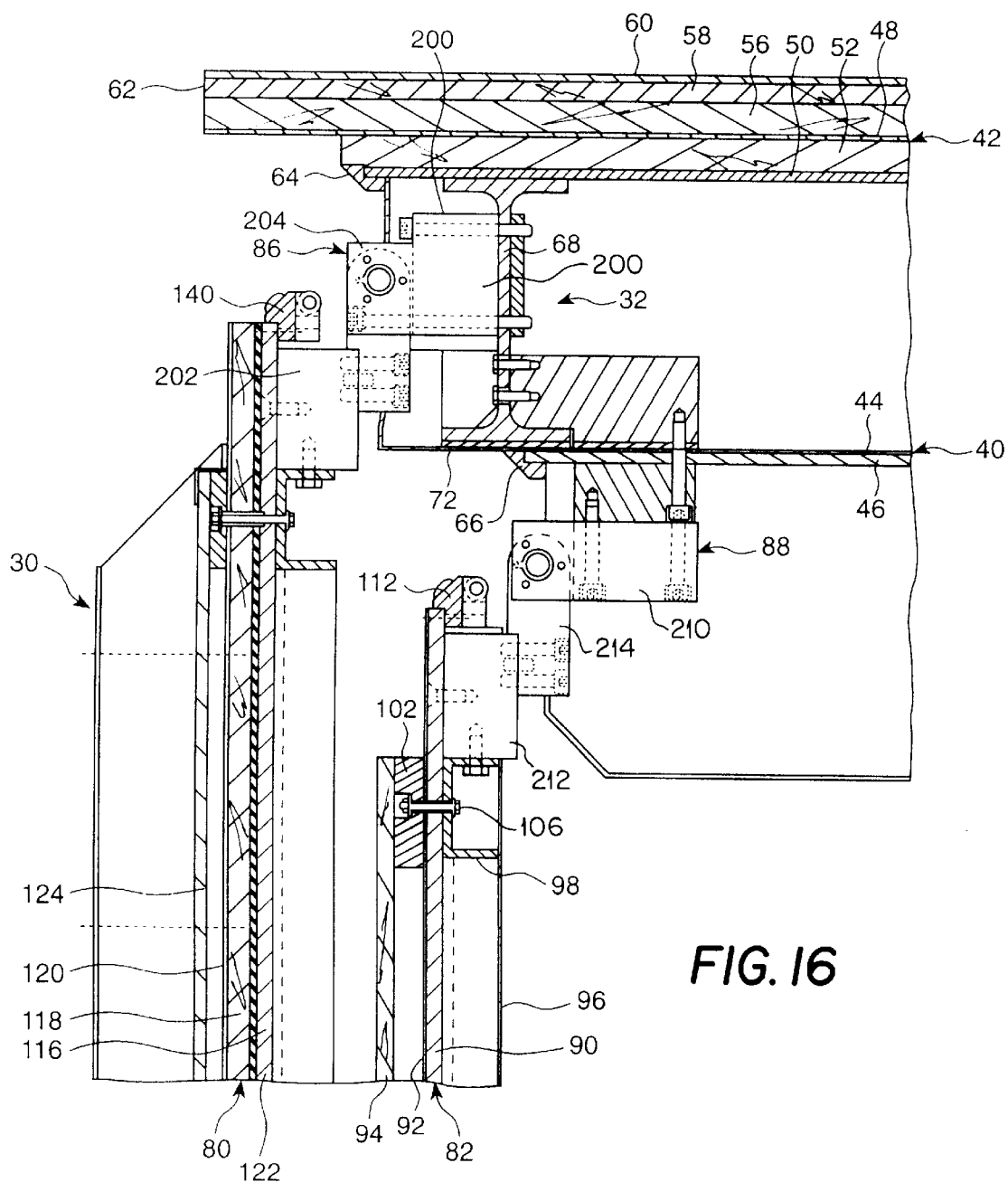
FIG. 16 is an enlarged fragmentary horizontal cross-sectional view of the interior and exterior sections of the door pivotally connected to the hinged side of the door frame.
Figure 17:
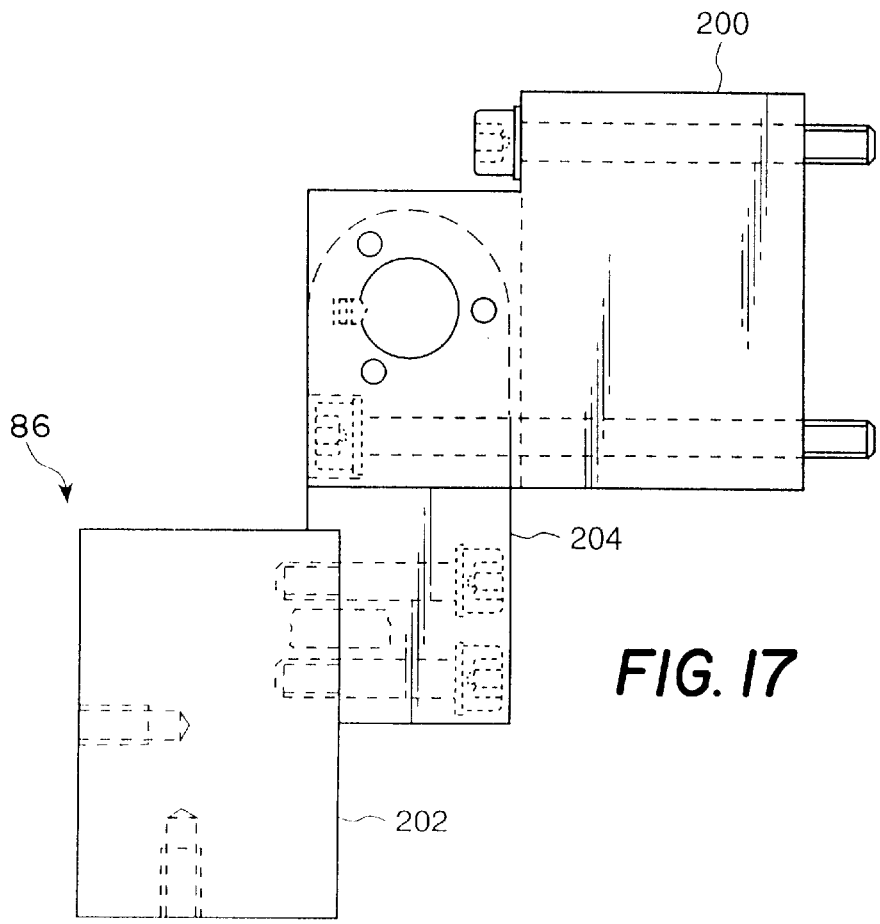
FIG. 17 is a top plan view of the inner hinge.
Figures 18A, 18B:
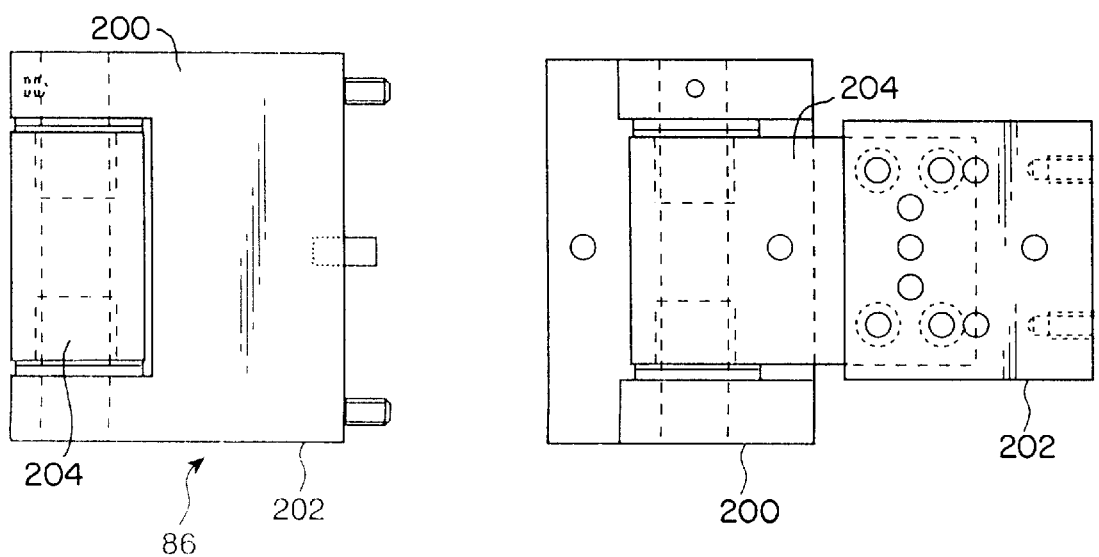
FIG. 18A is an end plan view of the inner hinge.
FIG. 18B is a side plan view of the inner hinge.
Figure 19:
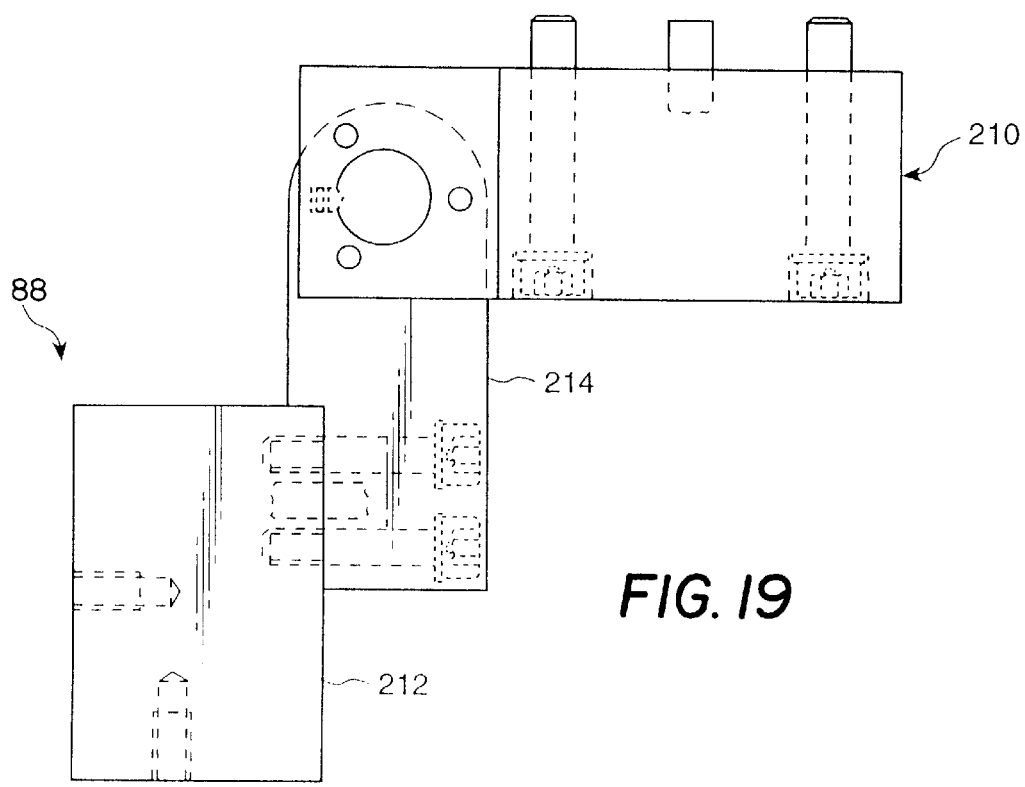
FIG. 19 is a top plan view of the outer hinge.
Figure 20A:
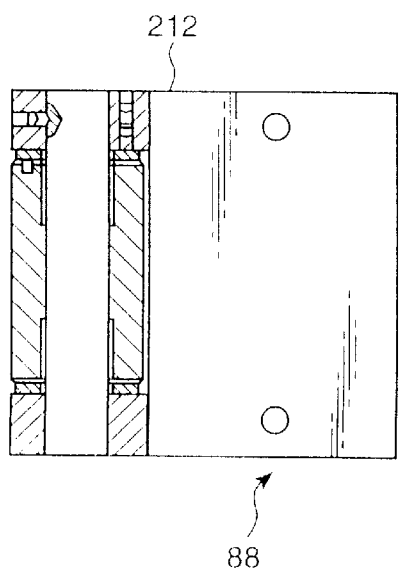
FIG. 20A is an end plan view of the outer hinge.
Figure 20B:
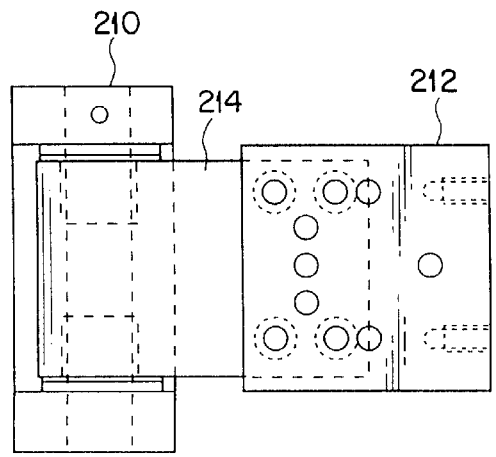
FIG. 20B is a side plan view of the outer hinge.

Referring to FIG. 16, the hinge side 77 of the door frame 32 also has a pair of inner hinges 86 and a pair of outer hinges 88 connected thereto. The inner pair of hinges 86 are disposed as upper and lower hinge. Both inner hinges 86 are secured to the I-beam 68 and are disposed between the I-beam 68 and the interior section 80 of the door 30. In particular, as illustrated in FIGS. 16 to 18B, each inner hinge 86 includes a base member 200 which is attached to the I-beam 68, a door member 202 which is attached to the interior section 80 of the door 30 and a pivot member 204 which spans between the door member 202 and the base member 200 and is secured to the door member 202 and is pivotally attached to the base member 200. The outer pair of hinges 88 are disposed as an upper and lower hinge 88. Both outer hinges 88 are secured to the exterior shell 40 and the exterior section 82 of the door 30. In particular, as illustrated in FIGS. 16 and 19 to 20B, each outer hinge 88 includes a base member 210 which is attached to the exterior shell 40, a door member 212 which is attached to the exterior section 82 of the door 30 and pivot member 214 which spans between the door member 214 and the base member 210 and is secured to the door member 214 and is pivotally attached to the base member 210.

Figure 21:
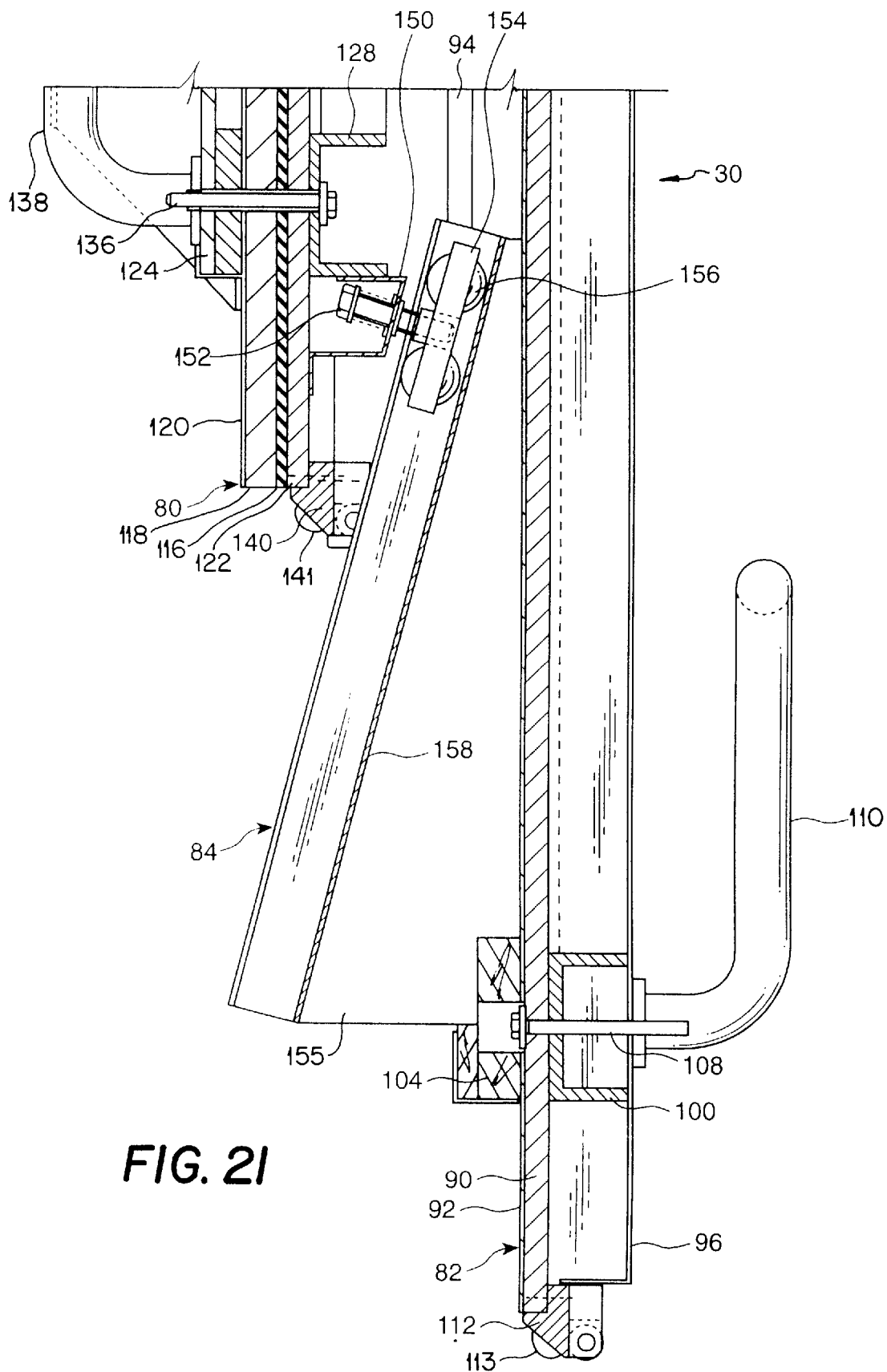
FIG. 21 is an enlarged fragmentary horizontal cross-sectional view of the free ends of the interior and exterior sections of the door in the open position and the synchronization assembly extending between the interior and exterior sections of the doors.
Figure 22:
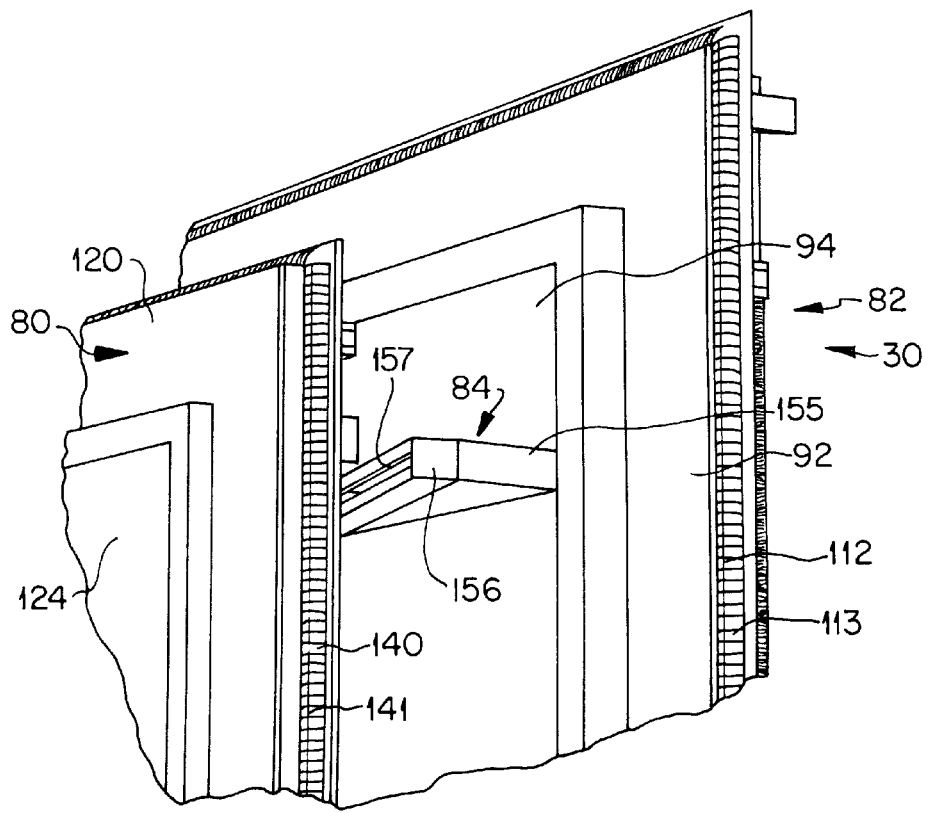
FIG. 22 is an enlarged fragmentary perspective view of upper portion of the door of the MSR further illustrating the synchronization assembly.
Figure 23:
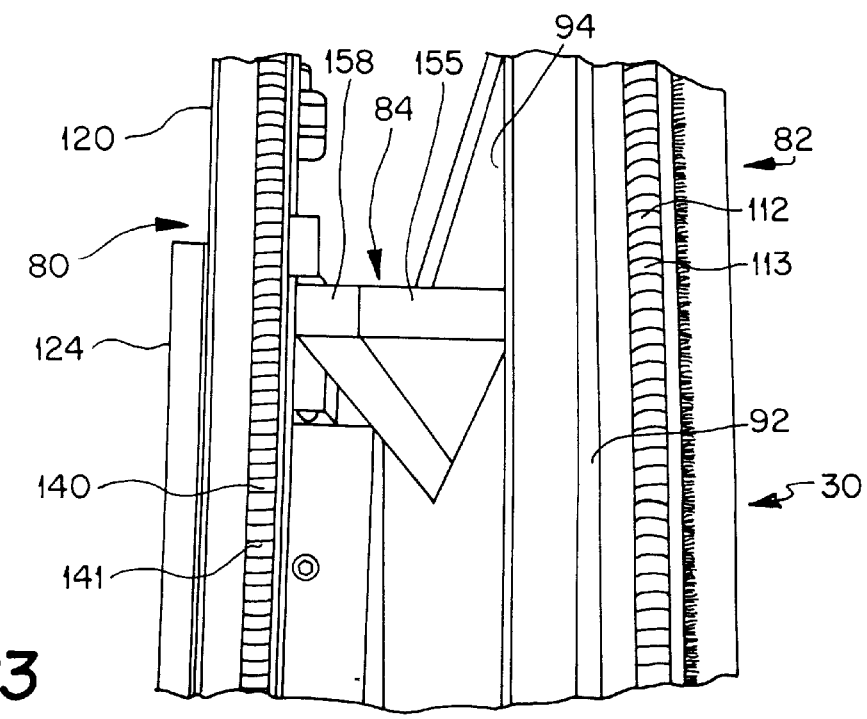
FIG. 23 is an enlarged fragmentary perspective view of upper portion of the door of the MSR further illustrating the synchronization assembly.

Referring to FIGS. 4, 16 and 21 to 24, the interior and exterior sections 80 and 82 of the door 30 are illustrated in greater detail. The outer shield 90 of the exterior section 82 of the door 30 is preferably formed from a highly electrically conductive material such as aluminum, which may be formed as a single sheet or as multiple layers, and the inner shield 92 of the exterior section 82 is preferably formed a highly magnetically permeable material such as the same nickel alloy that the inner shield 44 of the exterior shell 40 is made from. When the door 30 is in a closed position, as illustrated in FIG. 24, the outer shield 90 and the inner shield 92 of the exterior door section 82 are aligned with the outer shield 46 and inner shield 44 of the exterior shell 40. Specifically, the inner shield 92 of the exterior door section 82 contacts and overlaps the inner shield 44 of the exterior shell 40 along the entire door frame 32 to provide electric and magnetic continuity between the inner shield 92 of the exterior door section 82 and the inner shield 44 of the exterior shell 40. The outer shield 90 of the exterior door section 82 is aligned in the same vertical plane as the outer shield 46 of the exterior shell 40 along the entire door frame 32 to provide magnetic continuity between the outer shield 90 of the exterior door section 82 and the outer shield 46 of the exterior shell 40. As best seen in FIG. 21, several suitable bearing members 112 are attached along the side edges of the exterior section 82 of the door 30. When the door 30 is in the closed position, the bearing members 112 engage the bearing members 66 on the door frame 32. Each bearing member 112 also has a plurality of electronically conductive contact fingers 113 connected thereto. Electric continuity is achieved by the contact fingers 113 which engage the bearing members 66 when the door 30 is in the closed position. The contact fingers 113 may be made of beryllium copper or other suitable material. Each bearing member 112 also may have a surface or may include a slot for receiving the locking arm or lever 188 of the outer pneumatic locking mechanisms 160, 162 and 164.

The exterior section 82 of the door 30 further includes an inner panel 94, preferably made of wood, and an outer panel 96, preferably made of aluminum, suitably connected to the outer and inner shields 90 and 92 of the exterior section 82 by a series of brackets 98, 100, 102 and 104 and suitable fasteners 106 and 108. A handle 110 is connected to the exterior section 82 by the fastener 108. As illustrated in FIGS. 1, 4, 21 to 24, a synchronization assembly 84, as further described below, is connected to and between the interior section 80 and the exterior section 82 of the door 30.

As depicted in FIG. 21, the interior section 80 of the door 30 includes an outer shield 122, a first insulating layer 116, a second insulating layer 118 and an inner shield 120. The outer shield 122 is preferably formed from a highly electrically conductive material such as aluminum, which may be a single sheet or multiple layers. The first insulating layer 116 is preferably made from soft rubber. The second insulating layer 118 is preferably made from wood. The inner shield 120 is preferably formed from a highly magnetically permeable material such as the same nickel alloy as the inner shield 44 of the exterior shell 40. The inner and outer shields 120 and 122 are aligned with the inner and outer shields 48 and 50 of the interior shell 42 when the door 30 is in the closed position, as illustrated in FIG. 24. Specifically, the inner shield 120 contacts and overlaps the inner shield 48 of the interior shell 42 along the entire door frame 32 to provide electric and magnetic continuity between the inner shield 120 of the interior section 80 of the door 30 and the inner shield 48 of the interior shell 42 around the perimeter of the door 30. The outer shield 122 of the interior section 80 of the door 30 is aligned in the same vertical plane as the outer shield 50 of the interior shell 42 along the entire door frame 32 to provide magnetic continuity between the outer shield 122 of the interior section 80 of the door 30 and the outer shield 50 of the interior shell 42. As best seen in FIG. 21, several suitable bearing members 140 are attached along the side edges of the interior section 80 of the door 30. When the door 30 is in the closed position, the bearing members 140 engage the bearing members 64 on the door frame 32. Each bearing member 140 also has a plurality of electrically conductive contact finger 141 connected thereto. Electric continuity is achieved by the contact fingers 141 which engage the bearing members 64 when the door 30 is in the closed position. The contact fingers 141 may be made of beryllium copper or other suitable material. Each bearing member 140 also may have a surface or may include a slot for receiving the locking arm or lever 188a of the inner pneumatic locking mechanism 166. The interior section 80 of the door 30 further includes an inner panel 124, preferably made of wood, suitably connected to the inner shield 120, the outer shield 122, and the insulating layers 118 and 116 by a series of brackets 126, 128, 130 and 132 and fasteners 134 and 136. The interior section 80 of the door 30 includes a handle 138 attached to the interior section 80 by the fastener 136.

The synchronization assembly 84 of the door 30 connects the interior and exterior sections 80 and 82 of the door 30 to one another and forces the interior and exterior sections 80 and 82 to move in synchronization. The synchronization assembly 84, as best illustrated in FIGS. 21 to 24, includes a supporting bracket 150 suitably attached to bracket 128. A bolt 152 is threaded into and extends through the bracket 150 and is connected to a slider or roller assembly including a caster 154. The caster 154 has a pair of rollers 156 slideably received in the guide or connection tube, bar or member 158. The connection tube 158 is mounted on a wedge 155 which is attached to the exterior door section 82 and extends at an angle toward the interior door section 80. The connection tube 158 includes a slot 157 facing the interior section 80 of the door 30 for slideably receiving the bolt 152. The bolt 152 may be adjusted to alter the movement of the caster 154 and the rollers 156 in the connection tube 158. When the door is in the closed position, the caster 154 is at the end of the connection tube 158 adjacent to the free end of the exterior section 82 of the door 30, as illustrated in FIG. 24. As the door 30 opens, the caster 154 moves or slides on the rollers 156 to the opposite end of the connection tube 158 to the connection tube, as illustrated in FIG. 21. The movement of the interior and exterior sections 80 and 82 of the door 30 is thereby synchronized by the limited movement of the caster 154 in the connection tube 158. It should be appreciated that multiple synchronization assemblies 84 could be employed between the interior and exterior sections 80 and 82 of the door 30.

The MSR 20 room includes a pneumatic control box (not shown) on the exterior of the MSR 20 and a pneumatic control box (not shown) in the interior chamber 27 of the MSR 20. The pneumatic control box on the exterior of the MSR 20 includes a button for activating the pneumatic locking mechanisms 160, 162, 164 and 166 to lock the door 30 and a separate button for deactivating the pneumatic locking mechanisms 160, 162, 164 and 166 to unlock the door 30. The exterior pneumatic control box further includes a reset button for resetting the pneumatic system and an emergency stop button for immediately unlocking the pneumatic locking mechanisms 160, 162, 164 and 166. The exterior pneumatic control box also includes an indicator light for indicating that the pneumatic locking mechanisms 160, 162, 164 and 166 are in the locked position. The interior pneumatic control box similarly includes buttons for opening and closing the pneumatic locking mechanisms 160, 162, 164 and 166, an emergency stop button and an indicator light.

To lock the interior and exterior sections 80 and 82 of the door 30, the door 30 must be in the closed position as illustrated in FIG. 24. When the locking button on the control box is depressed, the pneumatic cylinders 182 of the locking mechanisms 160, 162, 164 and 166 are activated and cause the locking levers 188 to rotate and engage the bearing members 112 and 140 on the exterior and interior sections 80 and 82 of the door 30. Specifically, the locking levers 188 of the outer non-hinge side pneumatic locking mechanisms 160 engage the roller bearing members 112 which, in turn, engage the bearing members 66, thereby eliminating any gaps between the exterior shell 40 and the exterior section 82 of the door 30. Similarly, the locking levers 188 of the inner non-hinge side pneumatic locking mechanisms 166 engage the roller bearing members 140 which, in turn, engage the bearing members 64, thereby eliminating any gaps between the interior shell 42 and the interior section 80 of the door 30. The outer and inner hinge side pneumatic locking mechanisms 162 and 166 respectively engage the roller bearing members 112 and 140 in a similar manner to the outer and inner non-hinge side pneumatic locking mechanisms 160 and 166. The bearing members 112 and 140, in turn, engage the bearing members 66 and 64, respectively, to eliminate any gaps between the interior and exterior sections 80 and 82 of the door 30 and the hinge side 77 of the door frame 30. The pneumatic locking mechanisms 160 and 164 attached to the head 75 of the door frame 32 co-act in the same manner to eliminate gaps between the interior and exterior sections 80 and 82 of the door 30 and the head 75 of the door frame 32. The pneumatic locking mechanisms 160, 162, 164 and 166 thereby co-act to provide substantial pressure around the entire door frame 32 to assure electrical and magnetic continuity between the interior section 80 of the door 30 and the interior shell 42 and between the exterior section 82 of the door 30 and the exterior shell 40.

It will be understood that modifications and variations may be effected without departing from the scope of the novel concepts of the present invention, and it is understood that this application is to be limited only by the scope of the appended claims.

What is claimed is:

1. A door for a magnetically shielded room including a floor, a ceiling and a plurality of walls having an exterior shell and an interior shell disposed within and spaced apart from said exterior shell, said door comprising:

an exterior door section pivotally connected to the exterior shell;

an interior door section pivotally connected to the interior shell and spaced apart from the exterior door section; and a synchronization assembly connected between the interior door section and the exterior door section, whereby the synchronization assembly synchronizes the movement of the exterior door section and the interior door section when the door is moved between open and closed positions.

2. The door of claim 1, wherein the exterior door section is pivotally connected to the exterior shell by a plurality of outer hinges, and the interior door section is pivotally connected to the interior shell by a plurality of inner hinges.

3. The door of claim 2, wherein each outer hinge includes a base member connected to the exterior shell, a door member connected to the exterior door section and a pivot member pivotally connected to the base member and fixed to the door member, and each inner hinge includes a base member connected to the interior shell, a door member connected to the interior door section and a pivot member pivotally connected to the base member and fixed to the door member.

4. The door of claim 1, wherein the synchronization assembly includes a slider attached to one door section in sliding engagement with a guide member attached to the other door section.

5. The door of claim 4, wherein the slider is attached to the interior door section and the guide member is attached to and extends at an angle laterally from the exterior door section.

6. The door of claim 5, wherein the guide member includes a connection tube and the slider includes a caster having a plurality of rollers slidably received in the connection tube.

7. The door of claim 6, wherein the synchronization assembly includes a supporting bracket connected to the interior door section and a bolt connected to the caster and adjustably mounted to the supporting bracket, and the connection tube includes a slot facing the interior door section, wherein the bolt extends from the bracket through the slot to the caster in the connection tube.

8. The door of claim 1, which further includes at least one exterior door locking mechanism connected to the exterior shell and at least one interior door locking mechanism connected to the interior shell which co-act to lock the exterior door section and the interior door section when the door is in a closed position.

9. The door of claim 8, wherein the exterior door locking mechanism and the interior door locking mechanism each include a mounting plate, a first bearing support connected to one end of the mounting plate and a second bearing support connected to the other end of the mounting plate, a pneumatically operated double action cylinder connected to the first bearing support, a piston having a free end extendible from the cylinder, a fork secured to the free end of the piston and an L-shaped locking lever pivotally attached at one end to the fork and at the other end to the second bearing support.

10. The door of claim 9, which further include interior door bearing members attached to the interior door section and exterior door bearing members attached to the exterior door sections, whereby the locking levers in the interior door locking mechanisms engage the interior door bearing members and the locking levers in the exterior door locking mechanisms engage the exterior door bearing members when the exterior door locking mechanisms and interior door locking mechanisms are activated and the door is in the closed position.

11. A door construction for a magnetically shielded room including a floor, a ceiling and a plurality of walls having an exterior shell and an interior shell disposed within said exterior shell, the exterior shell includes an inner shield of a magnetically permeable material and an outer shield of an electrically conductive material, the interior shell includes an inner shield of a magnetically permeable material and an outer shield of an electrically conductive material, said door construction comprising:

a door frame in one of said walls, said door frame including a header, a hinge side, a non-hinge side and a threshold;

a door connected to the hinge side of the door frame, said door including an exterior door section pivotally connected to the hinge side of the door frame and an interior door section pivotally connected to the hinge side of the door frame and spaced apart from the exterior door section, said exterior door section including an inner shield of a magnetically permeable material and an outer shield of an electrically conductive material, said interior door section including an inner shield of a magnetically permeable material and an outer shield of an electrically conductive material;

at least one outer locking mechanism connected to the door frame;

at least one inner locking mechanism connected to the door frame; and a synchronization assembly connecting the interior door section and the exterior door section, whereby the synchronization assembly synchronizes the movement of the exterior door section and the interior door section when the door is moved between open and closed positions.

12. The door construction of claim 11, wherein the door frame includes a first opening defined by the inner shield of the interior shell, a second opening defined by the outer shield in the interior shell, a third opening defined by the inner shield in the exterior shell, and a fourth opening defined by the outer shield in the exterior shell, wherein the second opening is larger than the first opening, the third opening is larger than the second opening and the fourth opening is larger than the third opening.

13. The door construction of claim 12, which further includes interior shell bearing members connected to the outer shield of the interior shell around the perimeter of the second opening, exterior shell bearing members connected to the outer shield of the exterior shell around the perimeter of the fourth opening, interior door bearing members connected to the outer shield of the interior door section, exterior door bearing members connected to the outer shield of the exterior door section, whereby the interior door bearing members contact the interior shell bearing members and the exterior door bearing members contact the exterior shell bearing members to provide electric and magnetic continuity between the outer shields of the interior shell and interior door section and between the outer shields of the exterior shell and exterior door section when the door is in the closed position.

14. The door construction of claim 13, wherein the interior door bearing members and the exterior door bearing members include a plurality of conductive contact fingers which increase the electric continuity between the interior door bearing members and interior shell bearing members and the exterior door bearing members and the exterior shell bearing members when the door is in the closed position.

15. The door construction of claim 13, wherein the inner shield of the interior door section is larger than the first opening and the inner shield of the exterior door section is larger than the third opening, whereby the inner shield of the interior door section contacts and overlaps the inner shield of the interior shell and the inner shield of the exterior door section contacts and overlaps the inner shield of the exterior shell to provide electric and magnetic continuity between the inner shields of the interior shell and interior door section and between the inner shields of the exterior shell and exterior door section when the door is in the closed position.

16. The door construction of claim 11, which includes a plurality of outer locking mechanisms on the non-hinge side of the door frame, a plurality of outer locking mechanisms on the hinge side of the door frame, and a plurality of outer locking mechanisms on the header of the door frame.

17. The door construction of claim 16, which includes a plurality of inner locking mechanisms on the non-hinge side of the door frame, a plurality of inner locking mechanisms on the hinge side of the door frame, and a plurality of inner locking mechanisms on the header of the door frame.

18. The door construction of claim 11, wherein the door frame includes non-magnetically permeable I-beams which extend between the exterior shell and the interior shell around the entire door frame and insulating layers positioned between the I-beams and the inner shield of the exterior shell to electrically isolate or separate the exterior shell and the interior shell.

19. The door construction of claim 11, wherein the threshold includes an electrically conductive exterior threshold and an electrically conductive interior threshold.

20. The door construction of claim 19, which further includes an outer conductive bearing member attached to the outer shield of the exterior door section and an inner conductive bearing member attached to the interior door section, whereby the outer conductive bearing member is aligned with and contacts the exterior threshold and the interior conductive bearing member is aligned with and contacts the interior threshold when the door is in the closed position.

21. The door construction of claim 20, wherein the exterior and interior conductive bearing member are upside down T-shaped.

22. The door construction of claim 21, wherein the interior and exterior bearing members include a plurality of contact fingers.

23. The door construction of claim 19, wherein the threshold includes a non-conductive floor tile which extends between the exterior and interior thresholds.

24. A door construction for a magnetically shielded room including a floor, a ceiling and a plurality of walls having an exterior shell and an interior shell disposed within said exterior shell, said door construction comprising:

a door frame in one of said walls, said door frame including a header, two sides and a threshold;

an exterior door section;

means for pivotally connecting said exterior door section to the exterior shell;

an interior door section;

means for pivotally connecting said the interior door section to said interior shell;

means connected to the exterior door section and the interior door section for synchronizing the movement between the interior door section and the exterior door section.

25. The door construction of claim 24, which includes means connected to the door frame for securing the exterior door section to the exterior shell to assure even pressure between the exterior door section and exterior shell.

26. The door construction of claim 25, which includes means connected to the door frame for securing the interior door section to the interior shell to assure even pressure between the interior door section and interior shell.

* * * * *